(12) United States Patent
Kim et al.

(10) Patent No.: US 9,899,315 B2
(45) Date of Patent: Feb. 20, 2018

(54) WIRING FOR SEMICONDUCTOR DEVICE AND METHOD OF FORMING SAME

(71) Applicant: KOREA ELECTRONICS TECHNOLOGY INSTITUTE, Seongnam-si, Gyeonggi-do (KR)

(72) Inventors: Jun Chul Kim, Seongnam-si (KR); Dong Su Kim, Seongnam-si (KR); Se Hoon Park, Seongnam-si (KR); Jong Min Yook, Seongnam-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 119 days.

(21) Appl. No.: 14/781,991

(22) PCT Filed: Apr. 24, 2014

(86) PCT No.: PCT/KR2014/003619
§ 371 (c)(1),
(2) Date: Oct. 2, 2015

(87) PCT Pub. No.: WO2014/175687
PCT Pub. Date: Oct. 30, 2014

(65) Prior Publication Data
US 2016/0056108 A1    Feb. 25, 2016

(30) Foreign Application Priority Data
Apr. 25, 2013 (KR) ........................ 10-2013-0046355

(51) Int. Cl.
*H01L 23/522* (2006.01)
*H01L 23/48* (2006.01)
(Continued)

(52) U.S. Cl.
CPC .... *H01L 23/5226* (2013.01); *H01L 21/76805* (2013.01); *H01L 21/76843* (2013.01);
(Continued)

(58) Field of Classification Search
CPC ............. H01L 23/481; H01L 21/76898; H01L 21/76843; H01L 21/76805; H01L 21/768;
(Continued)

(56) References Cited

U.S. PATENT DOCUMENTS

| | | | |
|---|---|---|---|
| 5,770,509 A | 6/1998 | Yu et al. | |
| 5,952,704 A | 9/1999 | Yu et al. | |
| 7,612,428 B2 | 11/2009 | Park et al. | |
| 7,969,016 B2* | 6/2011 | Chen | H01L 21/76898 257/738 |
| 8,110,477 B2* | 2/2012 | Lin | H01L 27/016 257/531 |
| 8,362,599 B2* | 1/2013 | Kim | H01L 23/552 257/660 |
| 9,240,330 B2* | 1/2016 | Takeda | H01L 21/486 |
| 2007/0205855 A1* | 9/2007 | Hashimoto | H01F 5/003 336/200 |
| 2009/0140381 A1* | 6/2009 | Lin | H01L 21/76898 257/528 |

(Continued)

FOREIGN PATENT DOCUMENTS

| | | | |
|---|---|---|---|
| JP | 2000-260950 A | 9/2000 | |
| JP | 2007-180081 A | 7/2007 | |

(Continued)

OTHER PUBLICATIONS

International Searching Authority, International Search Report of PCT/KR2014/003619, dated Jun. 2, 2014. [PCT/ISA/210].

*Primary Examiner* — Bac Au
(74) *Attorney, Agent, or Firm* — Sughrue Mion, PLLC

(57) ABSTRACT

A method for forming a wiring for a semiconductor device according to an aspect of the present invention includes: forming a predetermined pattern on a first surface of a silicon substrate by selectively etching the first surface; coating, with a metal layer, a selected area of the first surface, including an area whereat the predetermined pattern is formed; forming organic material in the first surface to fill an etched portion and cover the coated metal layer; forming a plurality of via holes in the organic material and connecting the metal wiring to the coated metal layer through the via holes; and grinding a second surface corresponding to the first surface to remove a part of the metal layer formed in the etched portion.

8 Claims, 7 Drawing Sheets

(51) Int. Cl.
*H01L 49/02* (2006.01)
*H01L 21/768* (2006.01)
*H01L 23/528* (2006.01)
*H01L 23/532* (2006.01)

(52) U.S. Cl.
CPC ...... *H01L 21/76898* (2013.01); *H01L 23/481* (2013.01); *H01L 23/528* (2013.01); *H01L 23/5222* (2013.01); *H01L 23/5225* (2013.01); *H01L 23/5227* (2013.01); *H01L 23/5228* (2013.01); *H01L 23/5329* (2013.01); *H01L 28/10* (2013.01); *H01L 2924/0002* (2013.01)

(58) Field of Classification Search
CPC ........... H01L 21/76852; H01L 23/5223; H01L 23/5226; H01L 23/5222; H01L 23/5225; H01L 23/5227; H01L 23/5228; H01L 23/528; H01L 23/5386; H01L 23/645
See application file for complete search history.

(56) References Cited

U.S. PATENT DOCUMENTS

2011/0298130 A1* 12/2011 Kang .................... H01L 23/481
257/738
2015/0287681 A1* 10/2015 Soh ..................... H01L 25/0657
257/774

FOREIGN PATENT DOCUMENTS

KR  1998-044524 A  9/1998
KR  10-0683866 B1  2/2007

\* cited by examiner

WIRING FOR SEMICONDUCTOR DEVICE AND METHOD OF FORMING SAME

CROSS REFERENCE TO RELATED APPLICATIONS

This application is a National Stage of International Application No. PCT/KR2014/003619 filed Apr. 24, 2014, claiming priority based on Korean Patent Application No. 10-2013-0046355, filed Apr. 25, 2013, the contents of all of which are incorporated herein by reference in their entirety.

TECHNICAL FIELD

The present invention relates to a wiring for semiconductor devices and a method of forming the same.

BACKGROUND ART

A metal wiring formed by using photoresist (hereinafter referred to as "PR") and electroplating has limitation in forming a thick metal wiring having a high aspect ratio characteristic due to the limitation in the maximum thickness and the aspect ratio of the PR.

Furthermore, in a semiconductor device, there is a problem that the overall thickness of the module is increasing due to the thickness increase in the structure formed on the substrate surface.

Recently, an inductor structure, having a through silicon via (TSV), has been suggested in order to form a thick metal signal line.

However, in this case, there is a difficulty in the process wherein the via must be fully filled with metal; moreover, the high dielectric constant existing between the signal lines and the lossy characteristic of the silicon relatively degrade the performance of the inductor.

Especially, the densely integrated thin film inductors for a semiconductor device are being manufactured with the thickness less than 10 μm, and designed with a limited line width due to the limitation in the area thereof. Therefore, there is a limitation in implementing a high quality characteristic of an inductor for a semiconductor device due to the thin metal thickness and limitation in the line width of the wiring.

SUMMARY OF INVENTION

Technical Problem

An objective of the present invention is to provide an inductor and a transmission line for a semiconductor device whose electrical performances are enhanced, and a method for forming thereof.

Solution to Problem

A method for forming a wiring for a semiconductor device according to an aspect of the present invention includes the steps of: forming a predetermined pattern on a first surface of a silicon substrate by selectively etching the first surface; coating, with a metal layer, a selected area of the first surface, including an area whereat the predetermined pattern is formed; forming organic material in the first surface to fill an etched portion and cover the coated metal layer; forming a plurality of via holes in the organic material and connecting the metal wiring to the coated metal layer through the via holes; and grinding a second surface corresponding to the first surface to remove a part of the metal layer formed in the etched portion.

The step of connecting the metal wiring may include a step of forming a protection layer in the first surface whereat the metal wiring are formed to protect the metal wiring.

In the step of coating with a metal layer, the coating may be performed based on a skin depth of a high frequency signal in a way that neighboring parts of the metal layers are not in contact with each other.

In the step of grinding the second surface, the grinding may be performed in a way that a part of the metal layer formed in a bottom surface of the etched portion is totally removed while a part of the metal layer formed in a sidewall surface of the etched portion is still remaining.

A wiring for a semiconductor device according to an aspect of the present invention includes: a metal pattern including a metal layer formed on a first surface of a silicon substrate, wherein a part of the metal layer, which is formed in an etched portion by grinding a second surface of the silicon substrate corresponding to the first surface, is removed; a plurality of via holes penetrating the organic material formed in the first surface coated with the metal layer; and a plurality of metal wirings being connected to the metal layer through the via holes.

The metal pattern may include a metallic wall formed at a side of an etched portion of the first surface of the silicon substrate.

The metal pattern may be formed by coating the metal layer over a spiral pattern formed by etching the first surface of the silicon substrate in the shape of a spiral, and the metal layer coated on the spiral pattern may constitute an inductor.

The metal pattern may be formed by coating, with a metal layer, a plurality of strip patterns etched into the shape of a strip; and a transmission line may be formed by connecting each part of the metal layer coated on the strip patterns to a signal line or a ground line.

Advantageous Effects of Invention

According to an exemplary embodiment of the present invention, the vertically etched portion is coated with a metal layer so that wirings having width many times wider than the conventional wirings are formed in the same area, thus, a wiring for semiconductor device with an enhanced electrical performance and a superior shielding performance is provided.

In addition, the present invention provides an environment for forming a high power semiconductor device, wherein the wirings of a three dimensional structure and a large line width are embedded in the silicon substrate, thereby reducing the resistance of the inductor and the transmission line of the semiconductor device.

DETAILED DESCRIPTION OF EMBODIMENT

Hereinafter, exemplary embodiment of the present invention will be described in detail with reference to the accompanying drawings, so that a person skilled art can easily implement thereof. However, the present invention can be implemented in various different forms and is not limited to the exemplary embodiment examples. Furthermore, the parts irrelevant to the description are omitted in order to describe the present invention more clearly, and similar symbol numbers are assigned for the similar parts throughout the entire description.

Throughout the entire description, when there is an expression that a certain part (portion) includes a certain element, it means that the other elements may further be included not excluded, unless there is a specific description opposing the expression.

In addition, the term "unit" or "module" means a processing unit which performs at least a function or an operation, and this can be implemented with a hardware or a software, or the combination of a hardware and a software.

Figure 1:
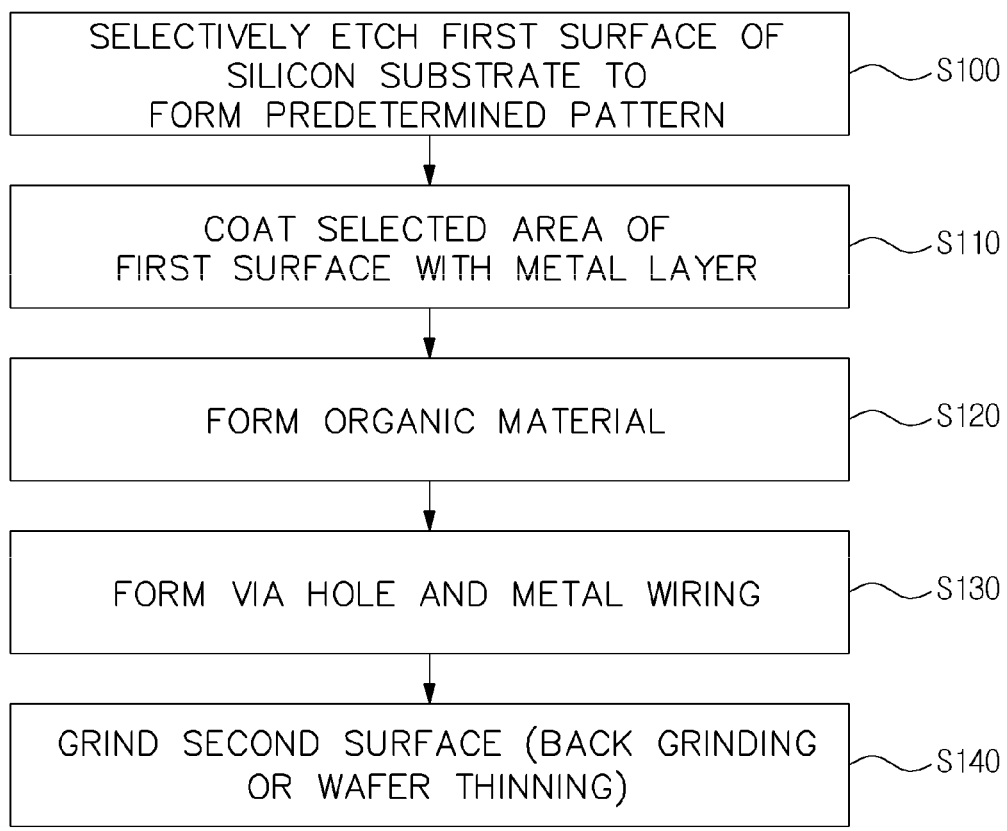
FIG. 1 is a flow diagram describing a method for forming a wiring for a semiconductor device according to an exemplary embodiment of the present invention.

Hereinafter, a wiring for a semiconductor device and a method for forming thereof according to an exemplary embodiment of the present invention will be described in detail with reference to the accompanying drawings FIG. 1 is a flow diagram describing a method for forming a wiring for a semiconductor device according to an exemplary embodiment of the present invention.

Referring to FIG. 1, a method for forming a wiring for a semiconductor device according to an exemplary embodiment of the present invention, in step S100, a predetermined pattern is formed by selectively etching a first surface of the silicon substrate. At this time, the predetermined pattern can be modified into various shapes depending on the usage of the semiconductor device.

For example, according to an exemplary embodiment of the present invention, the pattern may be formed in the shape of a spiral which constitutes an inductor for a semiconductor device, or in the shape of a strip to constitute a transmission line for a semiconductor device.

And, according to the method for forming a wiring for a semiconductor device, in step S100, the selected area of the silicon substrate is coated with a metal layer. At this time, the selected area includes the portion wherein a pattern is formed. And, the metal layer is coated by sputtering and electro plating methods. Also, the metal layer can be coated by vacuum deposition of the entire surface followed by etching thereof.

At this time, the thickness of the metal layer is formed in a way that the neighboring parts of the metal layer are not in contact with each other. For example, it is coated with the metal layer having a thickness less than half of the diameter or the width of the etched space. And, in the case for high frequency, the metal layer may be formed to have a thickness less than few micrometers by considering the skin depth of the high frequency signal.

And, according to the method for forming a wiring for a semiconductor device, in step S120, an organic material is formed in the first surface of the silicon substrate which is coated with the metal layer so that the selectively etched portion is being filled and cover the coated metal layer therewith at the same time. The organic material is formed using "organic lamination" technique, and may also be formed through various methods such as spin coating and the like.

And thereafter, according to the method for forming a wiring for a semiconductor device, in step S130, a plurality of the via holes and the metal wirings are formed in the first surface formed with the organic material. At this time, the metal wirings are connected with the coated metal layer beneath the organic material through the via holes.

And, according to the method for forming a wiring for a semiconductor device, in step S140, a portion of the metal layer formed in the etched portion is removed by grinding off (back grinding or wafer thinning) the second surface of the silicon substrate which is corresponding the first surface of the silicon substrate. At this time, the second surface of the silicon substrate is grinded off so that a portion of the metal layer formed on the sidewall surface of the etched portion is remaining while the metal layer formed in the bottom surface of the etched portion is completely removed. Therefore, the coated metal layer which is formed in the sidewall surface of the etched portion is maintained and being separated into a predetermined pattern.

Besides, in a method for forming a wiring for a semiconductor device according to an exemplary embodiment of the present invention, a protection layer (passivation layer) may be formed in the portion wherein the metal layer is formed in order to protect the metal wirings.

Figure 2:
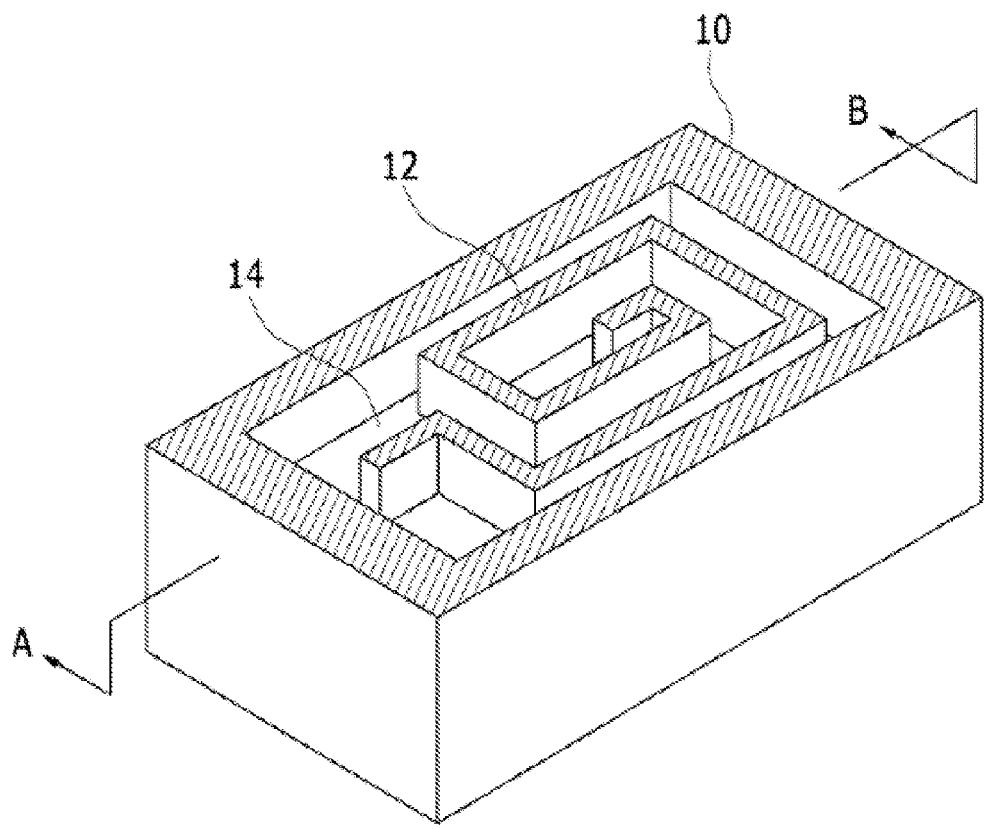
FIG. 2 is a perspective view of a silicon substrate wherein a spiral pattern is formed to constitute an inductor according to an exemplary embodiment of the present invention.
Figure 3A:
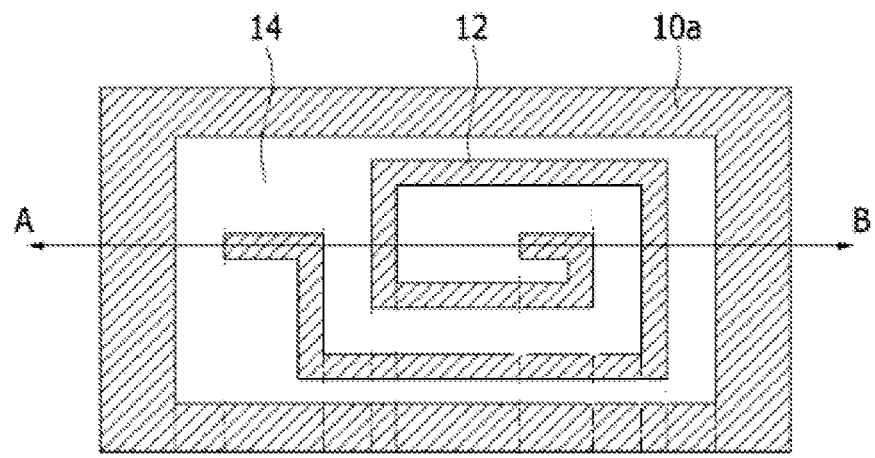
FIGS. 3A and 3B are a plan view and cross-sectional view illustrating a plan view of the silicon substrate and the cross-section cut along the line A-B of FIG. 2, respectively.
Figure 3B:
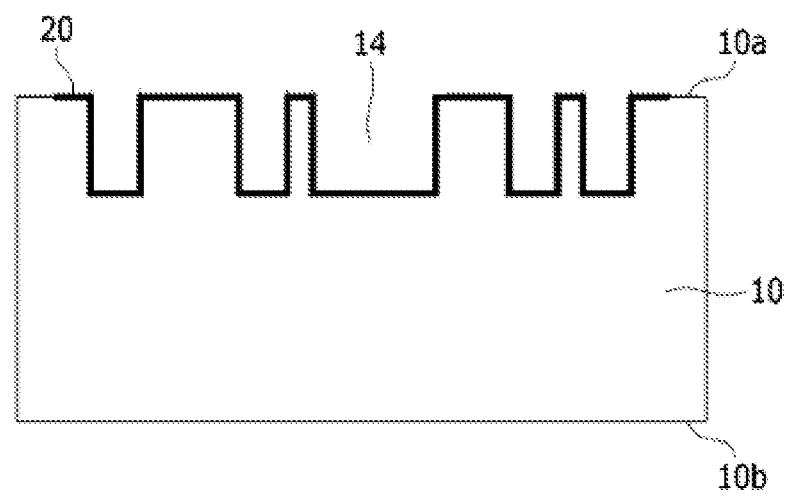

FIG. 2 is a perspective view of a silicon substrate wherein a spiral pattern is formed to constitute an inductor according to an exemplary embodiment of the present invention; and FIG. 3 is a cross-sectional view illustrating a plan view of the silicon substrate and the cross-section cut along the cut line A-B of FIG. 2.

Referring to FIG. 2, a pattern 12 of the three dimensional spiral shape is formed by vertically etching a first surface 10a which is the upper surface of the silicon substrate 10.

And then, the selected area of the first surface 10a including the etched portion 14 is coated with a metal layer 20. In here, the metal layer 20, which is coated on the pattern 12 of the spiral shape, will form the wirings of an inductor for the semiconductor device.

Thus, looking at the cross-section along the line A-B of FIG. 3, it shows that after the etched portion 14 is formed, the surface thereof is coated with the metal layer 20. At this time, the metal layer 20 is formed in a way that the neighboring parts of the metal layer are not in contact with each other.

Figure 4:
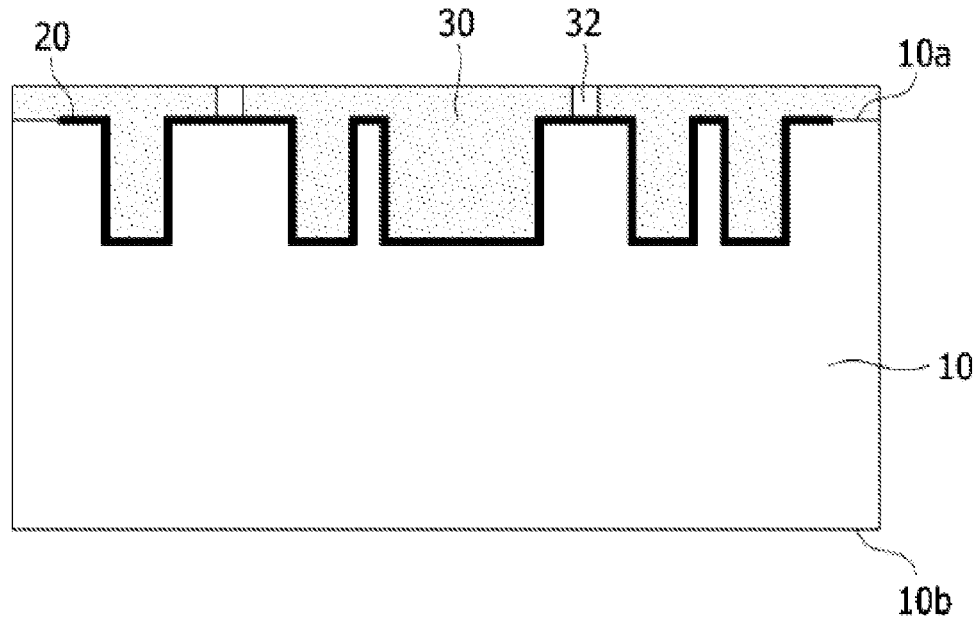
FIG. 4 is a cross-sectional view wherein an organic material is deposited on the silicon substrate according to FIG. 2 and via holes are formed therein.
Figure 5:
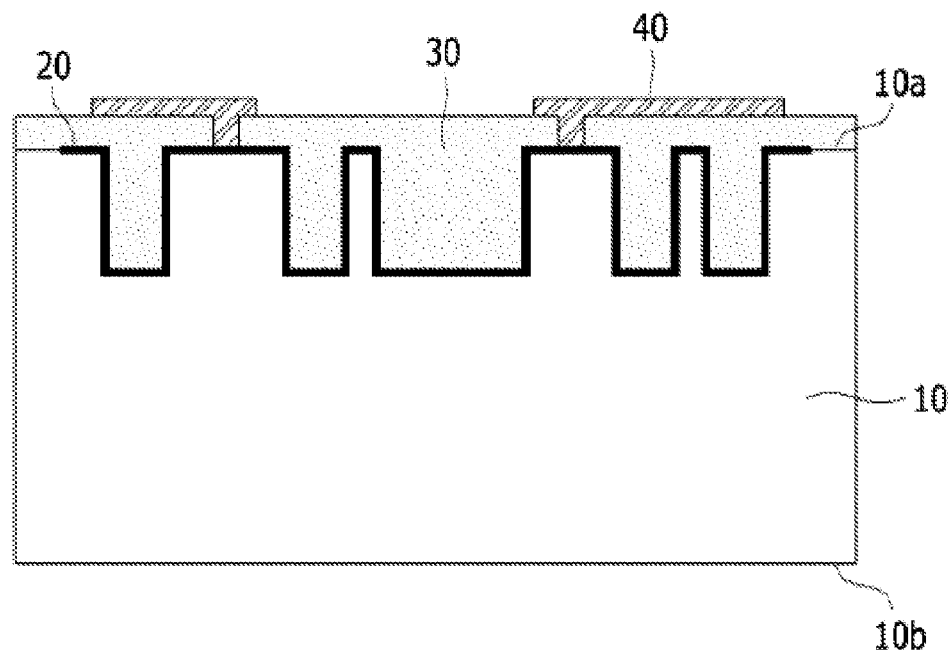
FIG. 5 is a cross-sectional view wherein the metal wirings are formed inside the via holes of the silicon substrate according to FIG. 4.

FIG. 4 is a cross-sectional view wherein an organic material is deposited on the silicon substrate according to FIG. 2 and via holes are formed therein; and FIG. 5 is a cross-sectional view wherein the metal wirings are formed inside the via holes of the silicon substrate according to FIG. 4.

Referring to FIG. 4, an organic material 30 is deposited on the first surface 10a of the silicon substrate which is coated with the metal layer 20. In here, the organic material 30 fills the etched portion of the first surface 10a of the silicon substrate and covers the coated metal layer 20.

In addition, according to an exemplary embodiment of the present invention, a plurality of via holes 32 are formed in the deposited organic material 30. At this time, each of the via holes 32 are formed down to the surface of the metal layer 20.

Referring to FIG. 5, according to an exemplary embodiment of the present invention, a plurality of the metal wirings 40 are formed inside the via holes 32. And the metal wirings 40 are connected to the metal layer 20 through the via holes 32.

Figure 6:
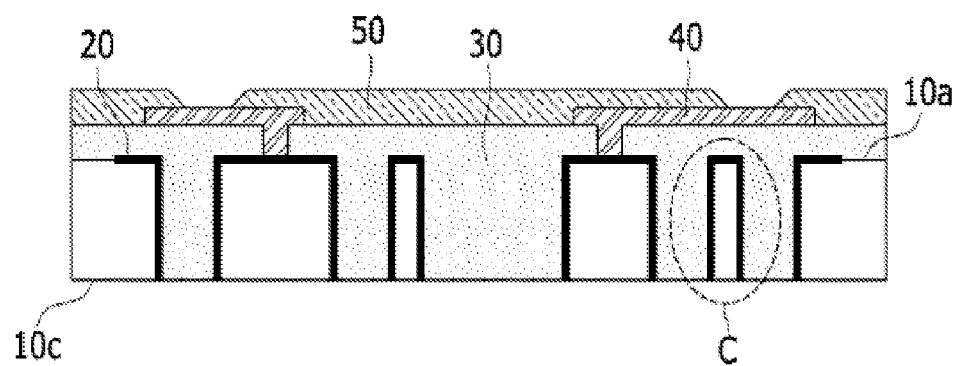
FIG. 6 is a cross-sectional view wherein the second surface of the silicon substrate according to FIG. 5 is grinded off, and a protection layer is formed on the surface of the other side.

FIG. 6 is a cross-sectional view wherein the second surface of the silicon substrate according to FIG. 5 is grinded off, and a protection layer is formed on the surface of the other side.

According to an exemplary embodiment of the present invention, a portion of the second surface 10b which is the lower surface of the silicon substrate 10 is grinded off up to the third surface 10c, thereby removing a portion of the coated metal layer 20.

In here, according to an exemplary embodiment of the present invention, the metal layer 20, which is coated in the bottom surface of the etched portion 14, is removed entirely; and it is grinded off in a way that a part of the metal layer 20, which is coated on the sidewall surface of the etched portion 14, is still remaining.

Thus, referring to FIG. 6, the metal layer 20 is being separated in the cross-sectional view as the metal layer 20 coated in the bottom surface of the etched portion 14 is removed; and the metal layer 20 coated in the sidewall surface of the etched portion 14 is still remaining, thereby forming the spiral pattern.

And, according to an exemplary embodiment of the present invention, a protection layer 50, as shown in FIG. 6, may be formed so as to protect the metal wirings 40.

Figure 7:
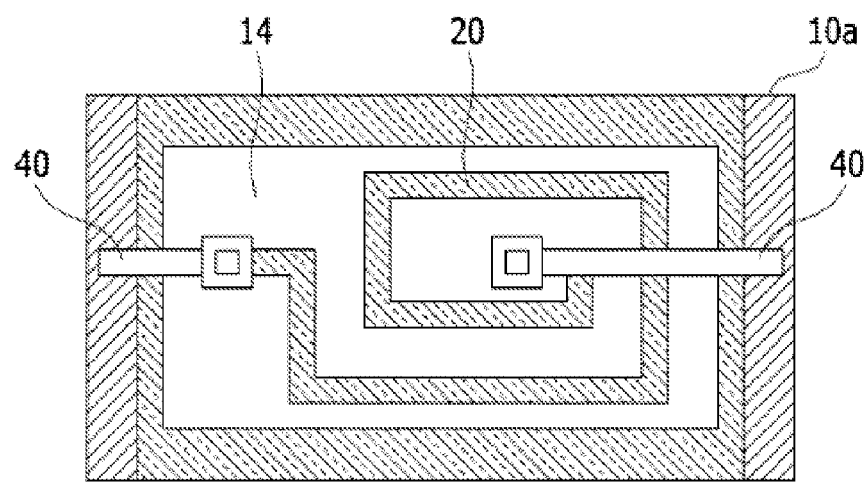
FIG. 7 is a see-through plan view wherein the metal layer inside the inductor formed according to FIG. 6 is being illustrated.

FIG. 7 is a see-through plan view wherein the metal layer inside the inductor formed according to FIG. 6 is being illustrated.

Each of the metal wirings 40 are connected to the metal layer 20 formed at the starting point and the end point of the spiral pattern respectively. In here, an organic material 30 is deposited on the metal layer 20.

Thus, according to an exemplary embodiment of the present invention, a metal layer 20 of a spiral pattern can be formed as shown in FIG. 7. And, the metal layer 20, formed in a spiral pattern, has a wide line width as shown in FIG. 6 since it is formed up to the sidewall surface of the etched portion 14.

Figure 8A:
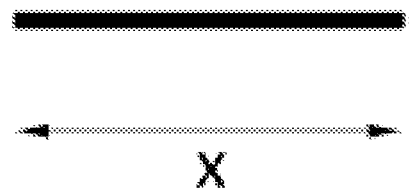
FIGS. 8A and 8B are a view of the resistance of the part denoted by "C" in FIG. 6 formed according to an exemplary embodiment of the present invention and a the resistance formed according to a method of the prior art, respectively.
Figure 8B:
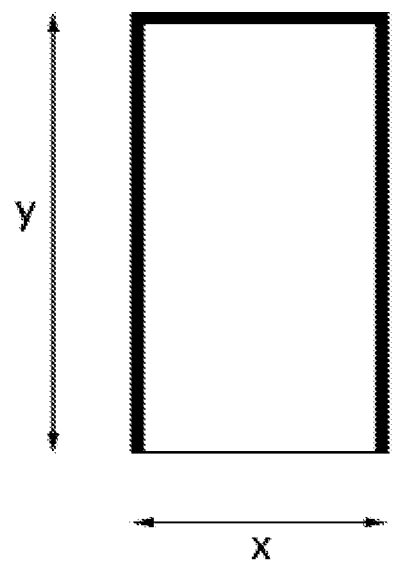

FIG. 8 is a view comparing: the resistance of the part denoted by "C" in FIG. 6 formed according to an exemplary embodiment of the present invention; and the resistance formed according to a method of the prior art.

A wiring for a semiconductor device according to an exemplary embodiment of the present invention shows an effect that the DC resistance of the wiring is decreasing in the same area when compared with the wiring formed by a typical method of the prior art.

As shown in FIG. 8a, although the line width of a wiring according to a method of the prior art is x, the line width W of the part "C" of FIG. 6 formed according to exemplary embodiment of the present invention can be expressed as Equation 1 below.

$$W=2y+x=x(2n+1) \qquad \text{(Equation 1)}$$

Where, x is the length of the metal layer coated on the upper surface of the spiral pattern, and y is the length of the metal layer coated on the sidewall surface of the spiral pattern. And, n is the aspect ratio representing the ratio of the x and y.

And, the relationship between the resistance R according to a method of the prior art and the resistance R' of the part "C" according to exemplary embodiment of the present invention can be expressed by Equation 2 as follows.

$$R' = \frac{R}{(2n+1)} \qquad \text{(Equation 2)}$$

Thus, the resistance R' of the part "C" is decreasing by $1/(2n+1)$ as the aspect ratio n is increasing. For example, it has an effect wherein the resistance is decreasing 5 times for the aspect ratio of about 2.

In this way, a wiring for a semiconductor device according to an exemplary embodiment of the present invention implements a larger line width for the same area, and decreases the resistance of the wiring, thereby implementing an inductor and a transmission line having a high quality factor and a low electrical loss.

Figure 9:
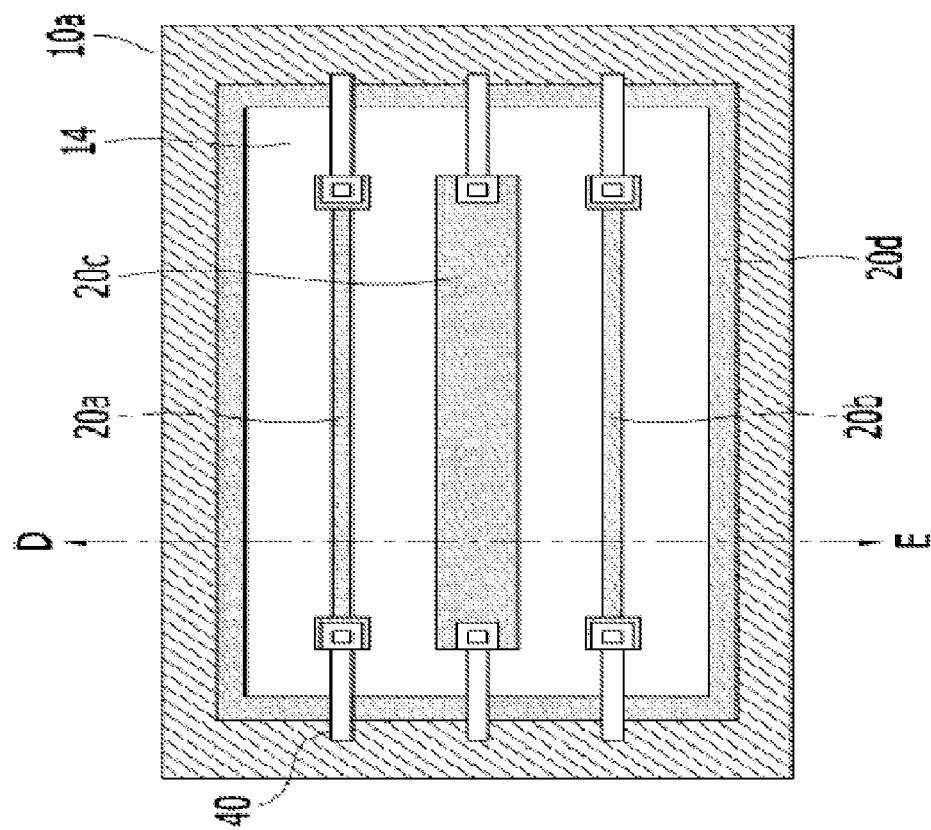
FIG. 9 is a see-through plan view wherein the metal layer of the transmission line formed according to another exemplary embodiment of the present invention is being illustrated.
Figure 10:
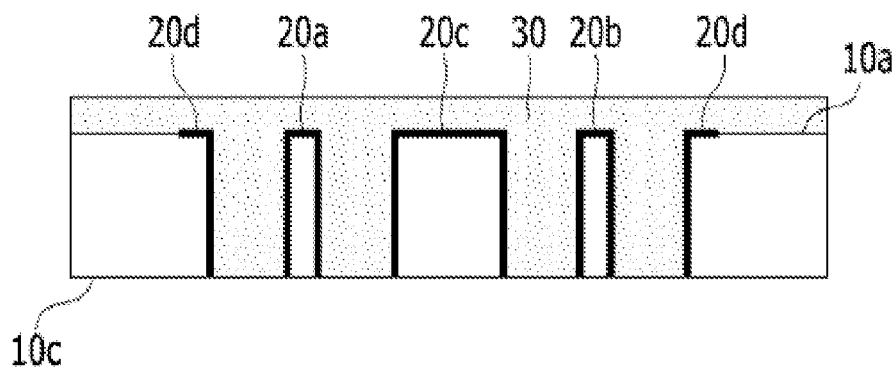
FIG. 10 is a cross-sectional view illustrating the cross-section cut along the line D-E of FIG. 9.

FIG. 9 is a see-through plan view wherein the metal layer of the transmission line formed according to another exemplary embodiment of the present invention is being illustrated; and FIG. 10 is a cross-sectional view illustrating the cross-section cut along the line D-E of FIG. 9.

Referring to FIG. 9, a wiring for a semiconductor device according to another exemplary embodiment of the present invention may form a transmission line for a semiconductor device by etching a portion 14 of the first surface 10a into the shape of a strip.

A plurality of the metal layers 20 are coated on the etched patterns which are etched into the shape of a strip. In here, the metal layers 20a and 20b may be connected to the signal line, and the metal layers 20c and 20d may be connected to the ground line.

As shown in FIG. 10, the transmission line is grinded off up to the third surface 10c; and the metal layer, which is coated in the bottom surface of the etched portion 14, is removed and separated into the metal layers 20a, 20b, 20c, and 20d; and the coated metal layers are still remaining in the surface of the etched portion 14.

Thus, a wiring for a semiconductor device according to another exemplary embodiment of the present invention forms a high performance transmission line having a shielding structure for use in a high frequency application. That is, the wiring structure as shown in FIG. 9 arranges the signal lines and the ground line in the shape of a strip, thereby implementing a transmission line of a low electrical loss in high frequency and a superior shielding property.

In this way, the exemplary embodiment of the present invention coats the vertically etched portion with a metal layer, thereby forming a wiring having a large line width which is several times larger than the typical line of the prior art in the same area; thus provides a wiring of an enhanced electrical performance and a superior shielding property for a semiconductor device.

And, the exemplary embodiment of the present invention is a method wherein the surface of a vertically etched structure, there is no additional increase in the thickness of the substrate since the structure thereof is embedded inside the substrate without any structure outwardly protruded from the silicon substrate.

In addition, the exemplary embodiment of the present invention provides an environment for forming a high power semiconductor device, wherein the wirings of a three dimensional structure and a large line width are embedded in the silicon substrate, thereby reducing the resistance of the inductor and the transmission line of the semiconductor device.

The above described exemplary embodiment of the present invention is not only implemented through the equipments and the method, but also can be implemented through the programming performing the functions corresponding the configuration of the exemplary embodiment of the present invention or the recording medium wherein such programming is recorded.

Although the exemplary embodiment of the present invention is described in detail as described above, the scope of the claims of the present invention is not limited to this; and various types of modifications and the improvements implemented by a person skilled in the art, which utilize the fundamental concept of the present invention as defined in the accompanying claims, also belong to the scope of the claims of the present invention.

What is claimed is:

1. A method for forming a wiring for a semiconductor device, the method comprising:
    forming a predetermined pattern on a first surface of a silicon substrate by selectively etching the first surface;
    coating, with a metal layer, a selected area of the first surface including an area whereat the predetermined pattern is formed;
    forming an organic material in the first surface to fill an etched portion and cover the coated metal layer;
    forming a plurality of via holes in the organic material and connecting a metal wiring to the coated metal layer through the via holes; and
    grinding a second surface corresponding to the first surface to remove a part of the metal layer formed in the etched portion;
    wherein the predetermined pattern is formed by one of the following:
    (i) coating the metal layer over a spiral pattern formed by etching the first surface of the silicon substrate in the shape of a spiral, and the metal layer coated on the spiral pattern constitutes an inductor; and
    (ii) coating the metal layer over a plurality of strip patterns formed by etching the first surface of the silicon substrate in the shape of a strip; and the metal layer coated on the strip patterns constitutes a transmission line by connected to a signal line or a ground line.

2. The method according to claim 1, wherein the step of connecting the metal wiring includes forming a protection layer in the first surface whereat the metal wirings are formed to protect the metal wiring.

3. The method according to claim 1, wherein, in the step of coating with the metal layer, the coating is performed based on a skin depth of a high frequency signal in a way that neighboring parts of the metal layer are not in contact with each other.

4. The method according to claim 1, wherein, in the step of grinding the second surface, the grinding is performed in a way that a part of the metal layer formed in a bottom surface of the etched portion is totally removed while a part of the metal layer formed in a sidewall surface of the etched portion is still remaining.

5. A wiring for a semiconductor device, comprising:
    a metal pattern including a metal layer formed on a first surface of a silicon substrate, wherein a part of the metal layer, which is formed in an etched portion, is removed by grinding a second surface of the silicon substrate corresponding to the first surface of the silicon substrate;
    a plurality of via holes penetrating organic material formed at the first surface coated with the metal layer; and
    a plurality of metal wirings connected to the metal layer through the via holes,
    wherein the metal pattern is formed by one of the following:
    (i) coating the metal layer over a spiral pattern formed by etching the first surface of the silicon substrate in the shape of a spiral, and the metal layer coated on the spiral pattern constitutes an inductor; and
    (ii) coating the metal layer over a plurality of strip patterns formed by etching the first surface of the silicon substrate in the shape of a strip; and the metal layer coated on the strip patterns constitutes a transmission line by connected to a signal line or a ground line.

6. The wiring according to claim 5, wherein the metal pattern further includes a metallic wall formed at a side of an etched portion of the first surface of the silicon substrate.

7. The wiring according to claim 6, wherein the metal pattern is formed by (i).

8. The wiring according to claim 6, wherein the metal pattern is formed by (ii).

* * * * *